US012113243B2

(12) United States Patent
Takahashi et al.

(10) Patent No.: US 12,113,243 B2
(45) Date of Patent: Oct. 8, 2024

(54) CONNECTION MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP); TOYOTA JIDOSHA KABUSHIKI KAISHA, Aichi (JP)

(72) Inventors: Hideo Takahashi, Mie (JP); Shinichi Takase, Mie (JP); Hiroki Shimoda, Mie (JP); Kouichi Nagamine, Aichi (JP); Masayuki Ueda, Aichi (JP); Yoshifumi Uchita, Shiga (JP); Takayuki Tsumagari, Shiga (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP); TOYOTA JIDOSHA KABUSHIKI KAISHA, Aichi (JP)

( * ) Notice: Subject to any disclaimer, the term of this patent is extended or adjusted under 35 U.S.C. 154(b) by 680 days.

(21) Appl. No.: 17/296,067

(22) PCT Filed: Nov. 1, 2019

(86) PCT No.: PCT/JP2019/043018
§ 371 (c)(1),
(2) Date: May 21, 2021

(87) PCT Pub. No.: WO2020/105401
PCT Pub. Date: May 28, 2020

(65) Prior Publication Data
US 2022/0021083 A1 Jan. 20, 2022

(30) Foreign Application Priority Data
Nov. 22, 2018 (JP) .................... 2018-219299

(51) Int. Cl.
*H01M 50/519* (2021.01)
*H01M 10/42* (2006.01)
(Continued)

(52) U.S. Cl.
CPC ....... *H01M 50/519* (2021.01); *H01M 10/425* (2013.01); *H01M 50/209* (2021.01);
(Continued)

(58) Field of Classification Search
CPC ................................................... H01M 50/519
See application file for complete search history.

(56) References Cited

U.S. PATENT DOCUMENTS 8,777,668 B2   7/2014 Ikeda et al.
10,084,211 B2  9/2018 Nomoto et al.
(Continued)

FOREIGN PATENT DOCUMENTS

JP   2012-227002 A    11/2012
JP   2013143281 A *   7/2013
(Continued)

OTHER PUBLICATIONS

International Search Report, WIPO, Application No. PCT/JP2019/043018, issued Jan. 28, 2020, English translation.

*Primary Examiner* — Maria Laios
*Assistant Examiner* — Jordan E Berresford
(74) *Attorney, Agent, or Firm* — GREENBLUM & BERNSTEIN, P.L.C.

(57) ABSTRACT

A connection module includes a FPC and bus bars connected to the FPC and connecting the electrode terminals of power
(Continued)

storage elements that are adjacent to each other. The FPC includes a first wiring portion, a second bus bar mount portion, and a third bus bar mount portion to which the bus bars are connected. The FPC further includes a second expandable/contractable portion and a third expandable/contractable portion. The second expandable/contractable portion is continuous from the second bus bar mount portion and allowed to be expanded and contracted in a direction to be closer to and farther away from the first wiring portion and the third bus bar mount portion. The third expandable/contractable portion is continuous from the third bus bar mount portion and allowed to be expanded and contracted in a direction to be closer to and farther away from the second bus bar mount portion.

6 Claims, 13 Drawing Sheets

(51) Int. Cl.
*H01M 50/209* (2021.01)
*H01M 50/50* (2021.01)
*H01M 50/502* (2021.01)
*H05K 1/18* (2006.01)

(52) U.S. Cl.
CPC ......... *H01M 50/50* (2021.01); *H01M 50/502* (2021.01); *H05K 1/189* (2013.01)

(56) References Cited

U.S. PATENT DOCUMENTS

| | | |
|---|---|---|
| 2012/0231638 A1 | 9/2012 | Ikeda et al. |
| 2014/0171159 A1 | 6/2014 | Endo et al. |
| 2014/0370343 A1 | 12/2014 | Nomoto et al. |

FOREIGN PATENT DOCUMENTS

| | | |
|---|---|---|
| JP | 5421449 B1 | 2/2014 |
| JP | 2014-086246 A | 5/2014 |
| JP | 2015-22965 | 2/2015 |
| JP | 5702947 B2 | 4/2015 |

* cited by examiner

2
CONNECTION MODULE

TECHNICAL FIELD

The technology disclosed herein relates to a connection module.

BACKGROUND ART

A connection module for an electric automobile or a hybrid automobile includes a battery block and a connection module. The battery block includes battery cells and the connection module is attached to the battery block to connect the battery cells. A flexible printed wiring board with bus bars has been known as such a connection module (refer to Patent Document 1). The flexible printed wiring board includes a flexible printed circuit board (FPC) and bus bars that are connected to the flexible printed circuit board and connect electrode terminals of adjacent power storage elements.

RELATED ART DOCUMENT

Patent Document

[Patent Document 1] Japanese Unexamined Patent Application Publication No. 2014-86246

SUMMARY OF THE INVENTION

Problem to be Solved by the Invention

The battery block including the battery cells has dimension tolerance due to manufacturing dimension errors among the battery cells and mounting errors of the battery cells. The dimension tolerance causes position displacement between the bus bar and the electrode terminals and this may hinder the attachment of the connection module to the battery block. Especially, when the number of battery cells is large, the dimension errors and the mounting errors of the battery cells are accumulated and the dimension tolerance as a whole may be increased.

Means for Solving the Problem

A connection module described herein is a connection module to be mounted on a power storage element group including power storage elements having electrode terminals and connecting the power storage elements. The connection module includes a flexible printed circuit board, and connection members connected to the flexible printed circuit board and connecting the electrode terminals of the power storage elements that are adjacent to each other. The flexible printed circuit board includes connection member mount portions to which the connection members are connected, and an expandable/contractable portion that is continuous from one connection member mount portion out of the connection member mount portions and allowed to be expanded and contracted in a direction to be closer to and farther away from another connection member mount portion out of the connection member mount portions that is adjacent to the one connection member mount portion.

According to the above configuration, each of the connection member mount portions is connected to some of the power storage elements included in the power storage element group. Therefore, the accumulation of the dimension errors and the mounting errors of the power storage elements corresponding to each of the connection member mount portions can be made smaller. The distances between the connection member mount portions are changed by the expansion or contraction of the expandable/contractable portion to deal with the position displacement of the electrode terminals. Accordingly, difficulty of mounting the connection module on the power storage element group is less likely to be caused and the mounting operability is improved.

In the above configuration, the expandable/contractable portion may be bent along fold lines extending parallel to each other and have a waveform including projection portions and recess portions alternately.

According to such a configuration, the expandable/contractable portion has a simple configuration and this avoids complicating of the configuration of the connection module.

In the above configuration, the connection module may further include a holding member that holds the connection members and the flexible printed circuit board and the holding member may include holding units that hold the connection member mount portions, respectively, and a connecting portion that connects the holding units that are adjacent to each other such that the holding units adjacent to each other are movable in a direction to be closer to and farther away from each other.

According to such a configuration, the flexible printed circuit board having flexibility can maintain its shape and the flexible printed circuit board and the connection members are collectively mounted in a predefined position on the power storage element group. The distances between the adjacent ones of the holding units can be changed via the connecting portion according to the change in the distances between the connection member mount portions. Accordingly, the flexible printed circuit board can be held by the holding member without hindering the movement of the adjacent connection member mount portions.

In the above configuration, each of the holding units may include a mount portion on which the flexible printed circuit board is disposed and a retaining portion that sandwiches and holds the expandable/contractable portion with the mount portion, and a distance between the mount portion and the retaining portion may be greater than a thickness of the flexible printed circuit board.

According to such a configuration, the flexible printed circuit board can be held by the holding member without hindering the expansion and contraction of the expandable/contractable portion.

Advantageous Effects of Invention

According to the connection module described herein, mounting operability can be improved.

MODES FOR CARRYING OUT THE INVENTION

Figure 1:
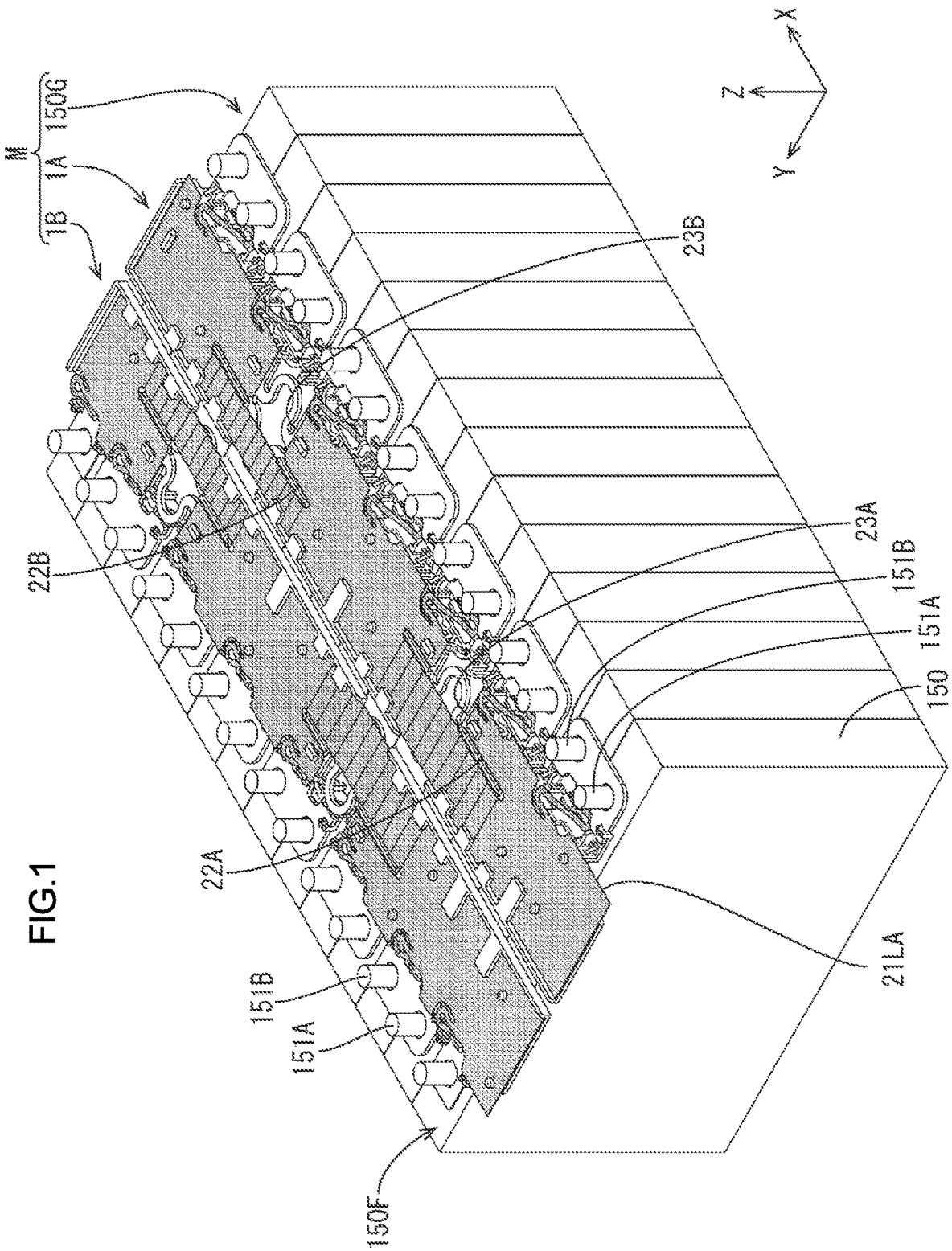
FIG. 1 is a perspective view of a power storage module according to one embodiment.

One embodiment will be described with reference to FIGS. 1 to 13. Connection modules 1A, 1B according to this embodiment is included in a power storage module M that is used as a power source for driving a vehicle such as an electric automobile or a hybrid automobile. As illustrated in FIG. 1, the connection modules 1A, 1B are attached to a power storage element group 150G including power storage elements 150 that are arranged in a row to connect the power storage elements 150 in series.

[Power Storage Element 150 and Power Storage Element Group 150G]

The power storage element 150 is a secondary battery, for example. As illustrated in FIG. 1, each of the power storage elements 150 has a rectangular parallelepiped flat shape and has an electrode mount surface 150F (an upper surface in FIG. 1) that is vertical to a surface of the power storage element 150 opposite an adjacent power storage element 150. Electrode terminals 151A, 151B are disposed on the electrode mount surface 150F. One of the electrode terminals 151A, 151B is an anode terminal 151A and another one is a cathode terminal 151B. Each of the electrode terminals 151A, 151B has a columnar shape and has threads on a peripheral surface thereof.

As illustrated in FIG. 1, the power storage elements 150 are arranged in a row and are configured as the power storage element group 150G. Among the power storage elements 150, every two adjacent power storage elements 150 are arranged such that the electrode terminals 151A, 151B having different polarities are disposed adjacent to each other (the anode terminal 151A of one power storage element 150 is disposed adjacent to the cathode terminal 151B of another power storage element 150 that is adjacent to the one power storage element 150).

In the following description, an arrangement direction in which the power storage elements 150 are arranged (a lower-left to upper-right direction in FIG. 1) corresponds to an X-axis direction, a direction extending along a surface of one power storage element 150 that is opposite another power storage element 150 next to the one power storage element 150 (a lower-right to upper-left direction in FIG. 1) corresponds to a Y-axis direction, and a direction vertical to the electrode mount surface 150F (an upper-lower direction in FIG. 1) corresponds to a Z-axis direction.

[Connection Module 1A, 1B]

The connection modules 1A, 1B are mounted on a surface (an upper surface in FIG. 1) of the power storage element group 150G including the electrode mount surfaces 150F of the power storage elements 150. As illustrated in FIG. 1, two connection modules 1A, 1B are mounted on the power storage element group 150G. One connection module 1A is attached to one of two rows of the electrode terminals 151A, 151B (the lower right row in FIG. 1) and another connection module 1B is attached to another one of the two rows (the upper left row in FIG. 1). The two connection modules 1A, 1B have a same configuration and the connection module 1A will be described as an example.

Figure 6:
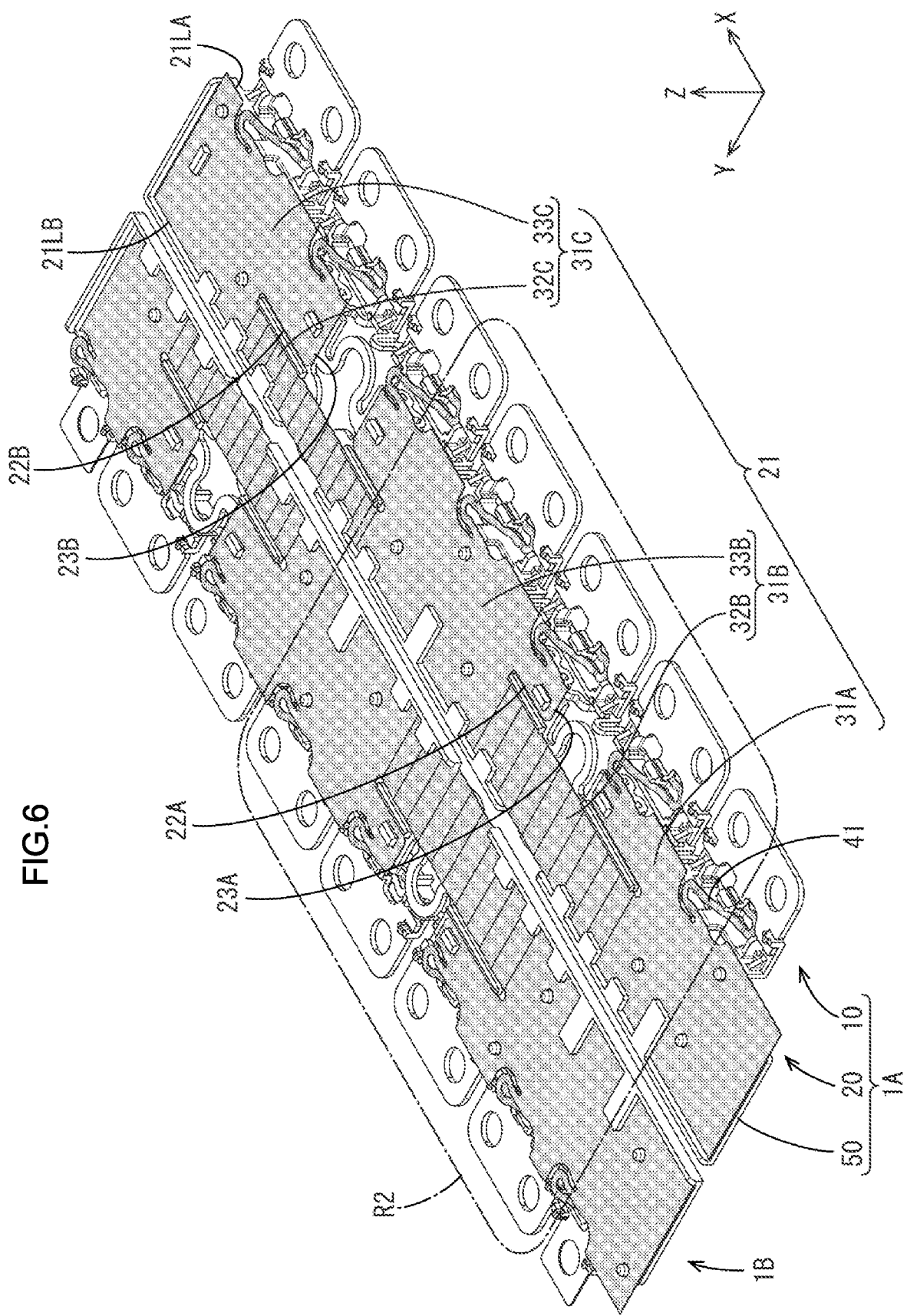
FIG. 6 is a perspective view of a connection module according to the embodiment.

As illustrated in FIG. 6, the connection module 1A includes a flexible printed circuit board 20 (hereinafter, referred to as a FPC 20), bus bars 10 (corresponding to a connection member), and a resin protector 50 (corresponding to a holding member). The bus bars 10 are connected to the FPC 20 and each of the bus bars 10 connects the anode terminal 151A and the cathode terminal 151B of the adjacent power storage elements 150. The resin protector 50 holds the bus bars 10 and the FPC 20.

(Bus Bar 10)

Figure 8:
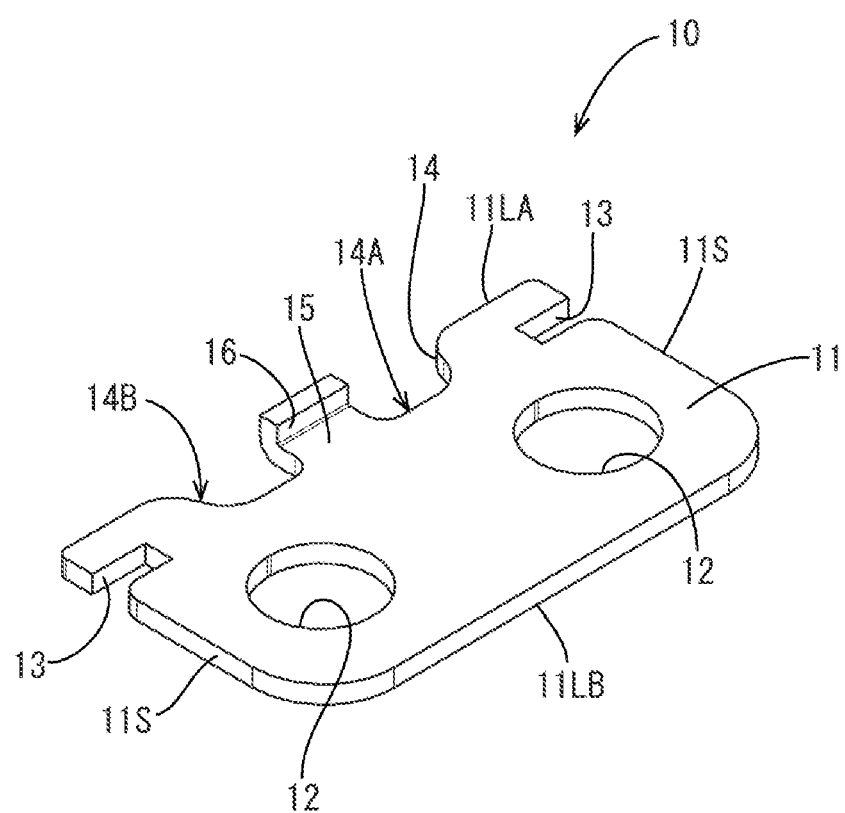
FIG. 8 is a perspective view of a bus bar according to the embodiment.

Each of the bus bars 10 is made of metal and includes an electrode connection portion 11, a FPC connection portion 15, and a stopper wall 16, as illustrated in FIG. 8. The electrode connection portion 11 connects the anode terminal 151A and the cathode terminal 151B of the adjacent power storage elements 150. The FPC connection portion 15 is continuous from the electrode connection portion 11 and connected to the FPC 20. The stopper wall 16 is continuous from the FPC connection portion 15.

The electrode connection portion 11 has a rectangular plate shape as a whole and has two electrode insertion holes 12 through which the electrode terminals 151A, 151B are inserted, respectively, and two recessed portions 13 to be fitted to the resin protector 50. The electrode connection portion 11 includes one of the electrode insertion holes 12 close to one of short sides 11S thereof and another one close to another one of the short sides 11S. One of the two recessed portions 13 is recessed from one of the short sides 11S of the electrode connection portion 11 and another one is recessed from the other one of the short sides 11S.

The electrode connection portion 11 has two long sides 11LA, 11LB and a connection recess 14 recessed from the long side 11LA. The connection recess 14 is defined by a first edge 14A that is parallel to the long side 11LA and two first side edges 14B that connect ends of the first edge 14A to the long side 11LA. The FPC connection portion 15 is a quadrangular plate portion that extends from the first edge 14A along a same plane surface as the electrode connection portion 11. The stopper wall 16 is a short wall plate portion that extends vertically from a distal end of the FPC connection portion 15.

(FPC 20)

Figure 7:
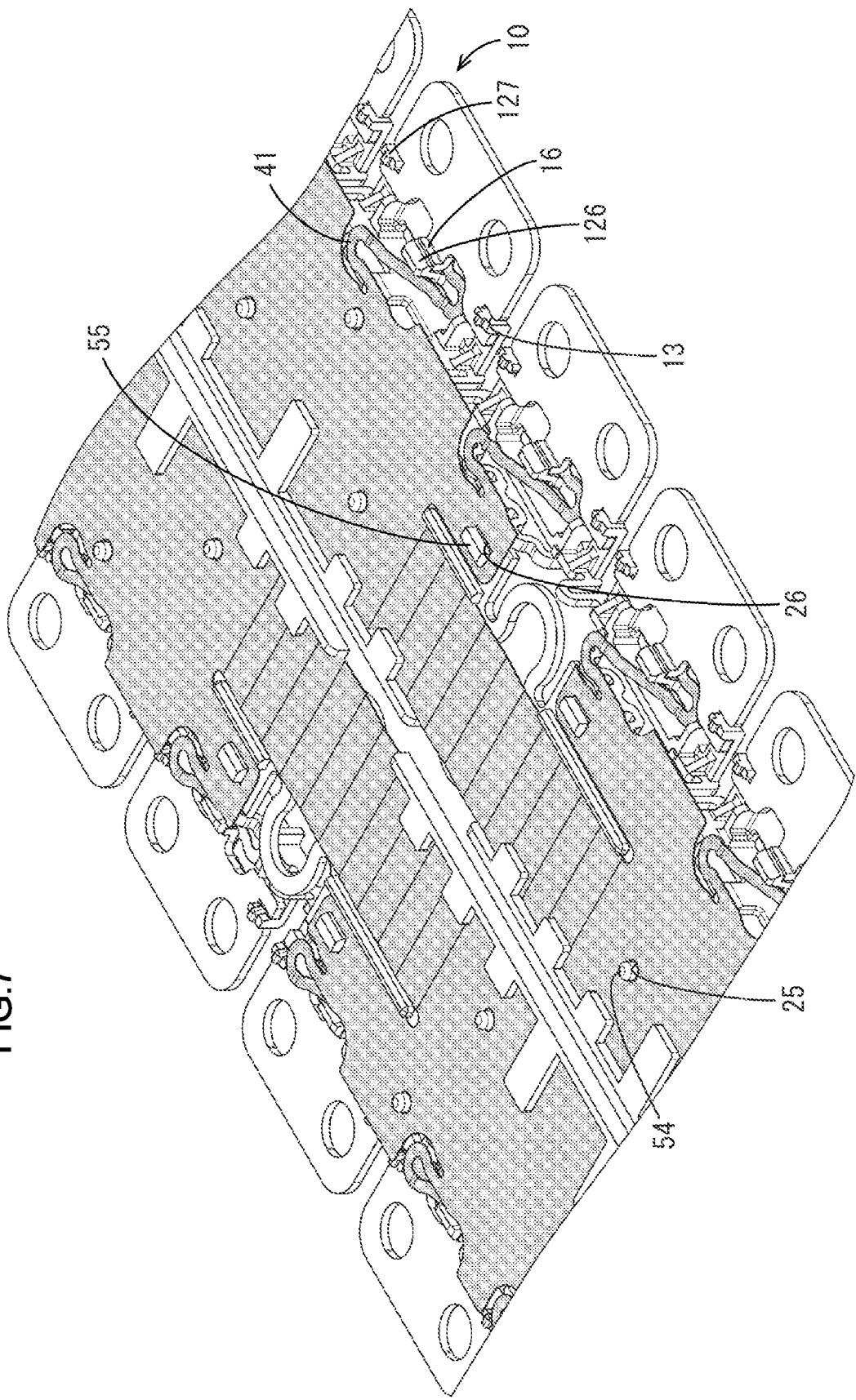
FIG. 7 is an enlarged view illustrating a portion surrounded by a frame R2 in FIG. 6.

The FPC 20 is for electrically connecting the bus bars 10 and an ECU (electric control unit, not illustrated) and is not illustrated in detail. The FPC 20 includes conductive wirings made of a copper foil and an insulating resin film that covers both surfaces of the conductive wirings. As illustrated in FIGS. 6 and 7, the FPC 20 includes a FPC body member 21 having a belt shape and first deformable portions 41 that are continuous from the FPC body member 21 and are connected to the respective bus bars 10.

The FPC body member 21 has an elongated rectangular shape as a whole and includes two slits (a first slit 22A and a second slit 22B), two notch portions (a first notch portion 23A and a second notch portion 23B), and three wiring portions (a first wiring portion 31A, a second wiring portion 31B, a third wiring portion 31C) that are defined by the two slits and the two notch portions.

As illustrated in FIG. 6, the first slit 22A and the second slit 22B extend parallel to two long sides 21LA, 21LB of the FPC body member 21. The FPC body member 21 includes the first slit 22A closer to one edge (a lower left edge in FIG. 6) thereof and closer to the long side 21LA (the lower one in FIG. 1) out of the long sides 21LA, 21LB of the FPC body member 21. The FPC body member 21 includes the second slit 22B closer to another edge (an upper right edge in FIG. 6) thereof and closer to the long side 21LB (the upper one in FIG. 1). The first notch portion 23A has a relatively wide opening space that extends from the long side 21LA to the first slit 22A. The second notch portion 23B has a relatively wide opening space that extends from the long side 21LA to the second slit 22B.

As illustrated in FIGS. 1 and 6, the FPC body member 21 includes the first wiring portion 31A at one end portion thereof (a left lower edge portion in FIG. 6) and the first wiring portion 31A is defined by the first slit 22A and the first notch portion 23A. The second wiring portion 31B includes a second expandable/contractable portion 32B (corresponding to an expandable/contractable portion) and a second bus bar mount portion 33B (corresponding to a connection member mount portion). The second expandable/contractable portion 32B is continuous from the first wiring portion 31A and defined by the first slit 22A. The second bus bar mount portion 33B is continuous from the second expandable/contractable portion 32B and defined by the first slit 22A, the first notch portion 23A, the second slit 22B, and the second notch portion 23B. The third wiring portion 31C includes a third expandable/contractable portion 32C (corresponding to the expandable/contractable portion) and a third bus bar mount portion 33C (corresponding to the connection member mount portion). The third expandable/contractable portion 32C is continuous from the second bus bar mount portion 33B and defined by the second slit 22B. The third bus bar mount portion 33C is continuous from the third expandable/contractable portion 32C and defined by the second slit 22B and the second notch portion 23B. The first wiring portion 31A has no expandable/contractable portion and the whole first wiring portion 31A corresponds to the connection member mount portion to which the bus bar 10 is connected. The first wiring portion 31A, the second bus bar mount portion 33B, and the third bus bar mount portion 33C are arranged in a row along the long side 21LA.

Figure 3:
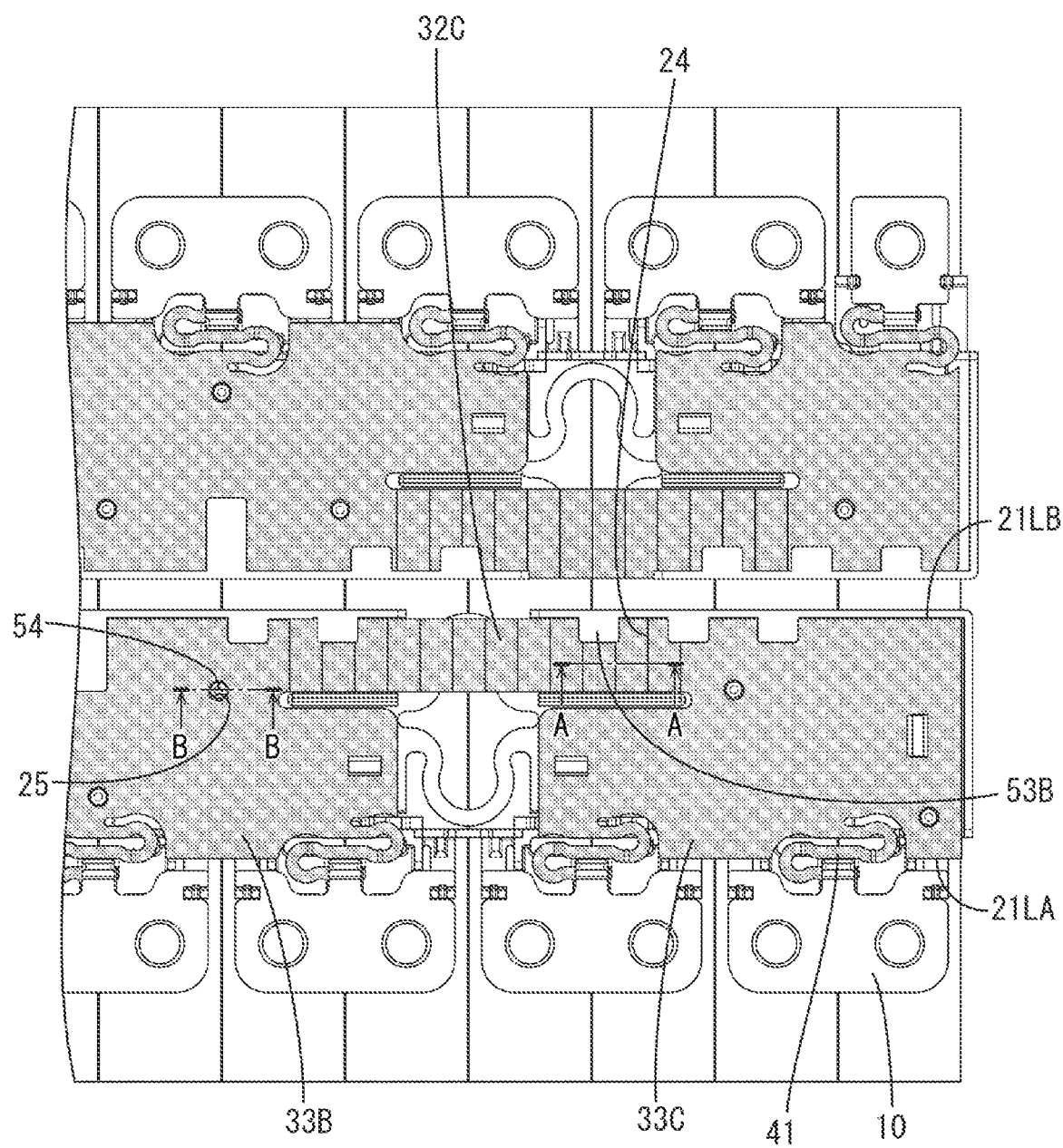
FIG. 3 is an enlarged view illustrating a portion surrounded by a frame R1 in FIG. 2.
Figure 4:
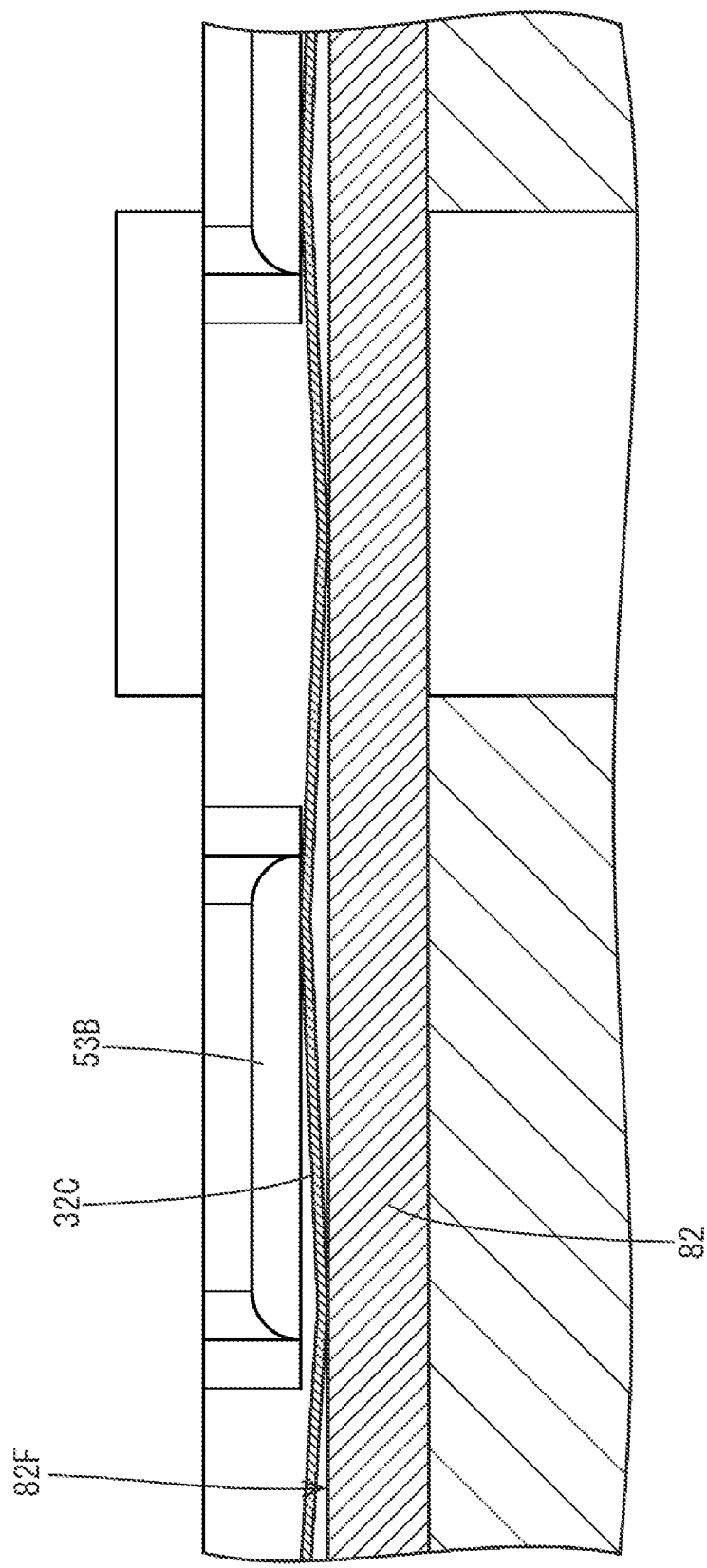
FIG. 4 is a cross-sectional view taken along A-A line in FIG. 3.
Figure 5:
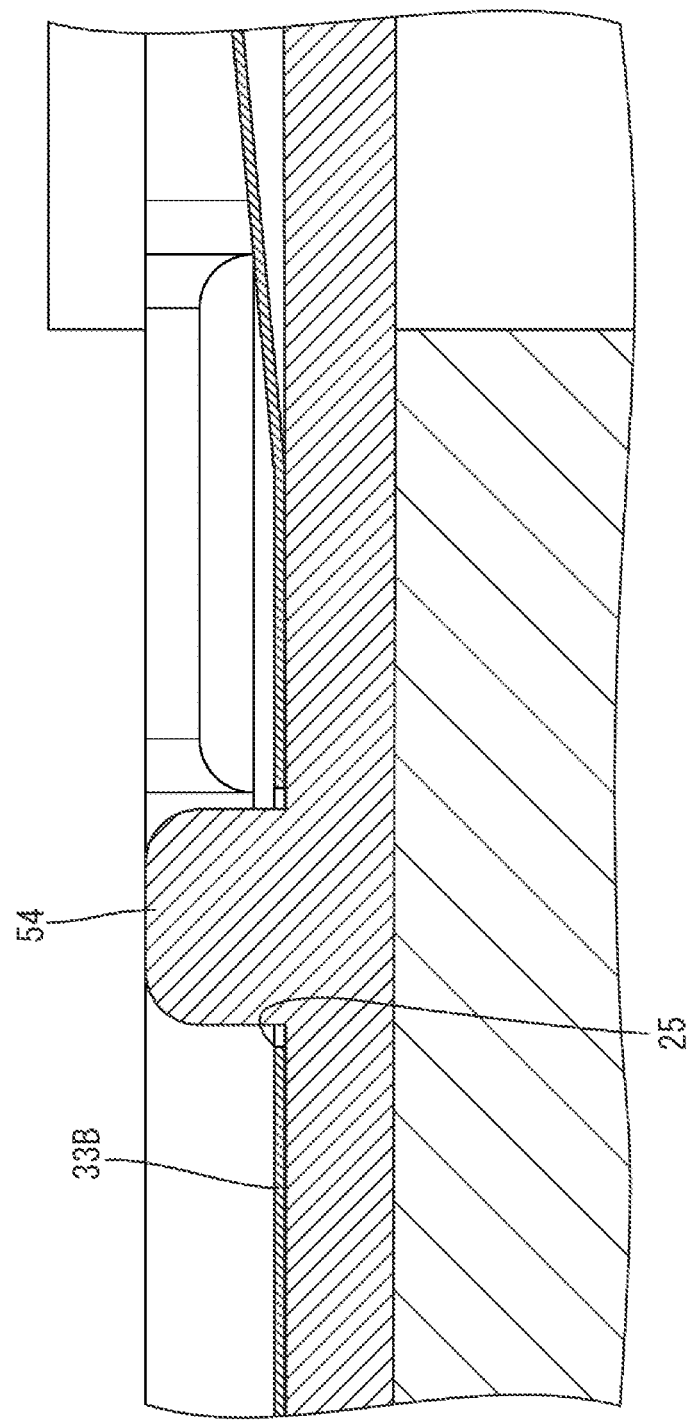
FIG. 5 is a cross-sectional view taken along B-B line in FIG. 3.

As illustrated in FIGS. 3 and 4, the third expandable/contractable portion 32C is slightly bent along fold lines 24 that extend vertically to the long sides 21LA, 21LB so as to be bent in a waveform including projection portions and recess portions alternately. The third expandable/contractable portion 32C can be expanded or contracted in the direction along the long sides 21LA, 21LB (a right-left direction in FIG. 3) by changing the bending angle. The second expandable/contractable portion 32B has a configuration similar to that of the third expandable/contractable portion 32C. According to such a configuration, the second bus bar mount portion 33B and the third bus bar mount portion 33C are allowed to move in a direction to be closer to and farther away from the first wiring portion 31A. In other words, the second bus bar mount portion 33B is allowed to move in the direction to be closer to and farther away from the first wiring portion 31A and the third bus bar mount portion 33C by the expansion and contraction of the second expandable/contractable portion 32B. The third bus bar mount portion 33C is allowed to move in the direction to be closer to and farther away from the second bus bar mount portion 33B by the expansion and contraction of the third expandable/contractable portion 32C.

Each of the first wiring portion 31A, the second bus bar mount portion 33B, and the third bus bar mount portion 33C includes positioning holes 25.

The first wiring portion 31A includes a fitting hole 26 adjacent to the first notch portion 23A. The second bus bar mount portion 33B includes one fitting hole 26 adjacent to the first notch portion 23A and another fitting hole 26 adjacent to the second notch portion 23B. The third bus bar mount portion 33C includes one fitting hole 26 adjacent to the second notch portion 23B and another fitting hole 26 adjacent to an edge that is opposite from the second bus bar mount portion 33B.

As illustrated in FIGS. 3 and 7, the first deformable portion 41 is an elongated S-shaped plate spring portion that is continuous from the FPC body member 21. As illustrated in FIG. 6, the first deformable portions 41 are arranged in a row along the long side 21LA and some of the first deformable portions 41 are continuous from the first wiring portion 31A, another ones of the first deformable portions 41 are continuous from the second bus bar mount portion 33B, and the rest of them are continuous from the third bus bar mount portion 33C. A portion of the wirings is exposed at a distal end of the first movable portion 41 as a connection land (not illustrated) that is a connection portion, and the FPC connection portion 15 is connected to the connection land with soldering.

(Resin Protector 50)

Figure 9:
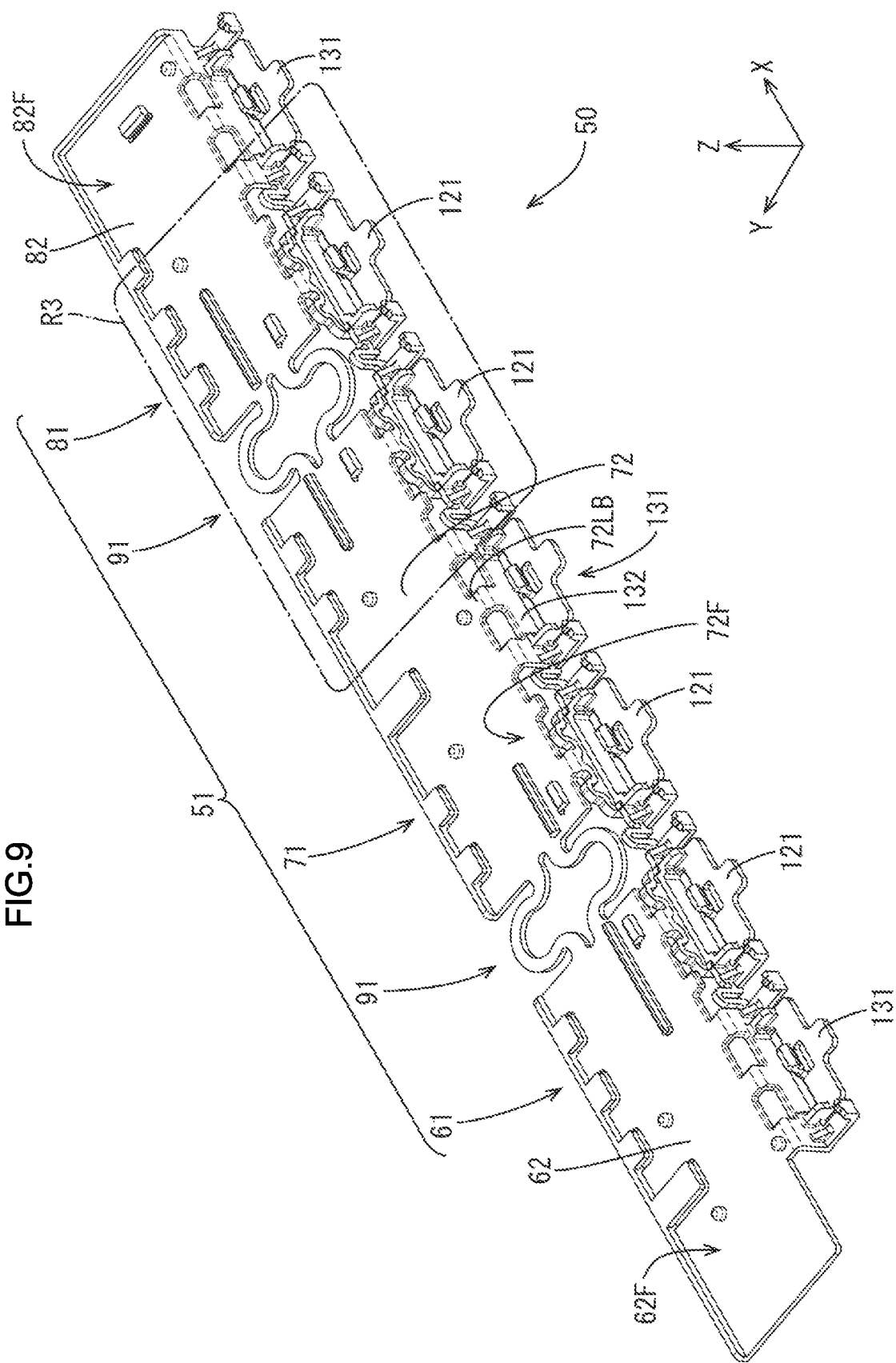
FIG. 9 is a perspective view of a resin protector according to the embodiment.

The resin protector 50 is made of synthetic resin and includes a FPC holding portion 51 that holds the FPC body member 21 and bus bar holding portions 121, 131 that hold the bus bars 10, respectively, as illustrated in FIG. 9.

As illustrated in FIG. 9, the FPC holding portion 51 includes three holding units (a first holding unit 61, a second holding unit 71, a third holding unit 81) and two first connecting portions 91 (corresponding to a connecting portion) that connect the adjacent ones of the holding units 61, 71, 81. The FPC holding portion 51 is an elongated rectangular plate that has a substantially same size as that of the FPC body member 21 as a whole. The first holding unit 61 holds the first wiring portion 31A and a portion of the second expandable/contractable portion 32B adjacent to the first wiring portion 31A. The second holding unit 71 holds a portion of the second expandable/contractable portion 32B adjacent to the second bus bar mount portion 33B, the second bus bar mount portion 33B, and a portion of the third expandable/contractable portion 32C adjacent to the second wiring portion 31B. The third holding unit 81 holds a portion of the third expandable/contractable portion 32C adjacent to the third bus bar mount portion 33C and the third bus bar mount portion 33C.

Figure 11:
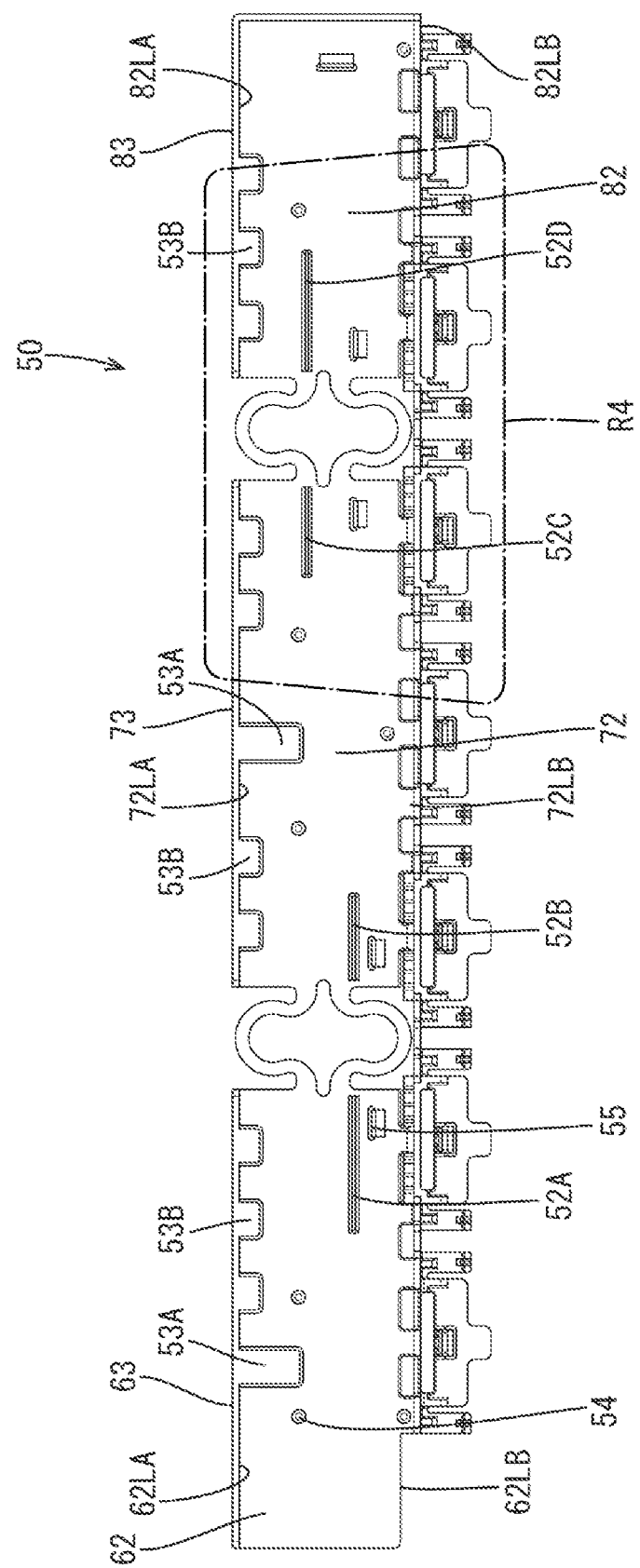
FIG. 11 is a plan view of the resin protector according to the embodiment.

As illustrated in FIGS. 9 and 11, the first holding unit 61 includes a first mount plate 62 (corresponding to a mount portion), a first side rib 63 projecting from the first mount plate 62, a first retaining piece 53A and second retaining pieces 53B (corresponding to the retaining portion). The first retaining piece 53A and the second retaining pieces 53B are continuous from the first side rib 63.

As illustrated in FIGS. 9 and 11, the first mount plate 62 is a rectangular plate as a whole. The first mount plate 62 has one surface (an upper surface in FIG. 9) as a first mount surface 62F on which the FPC body member 21 is disposed. The first side rib 63 is a thin elongated portion that projects from a long side 62LA (the upper one in FIG. 11) out of the long sides 62LA, 62LB of the first mount plate 62. As illustrated in FIG. 11, the first retaining piece 53A is an elongated narrow plate member that extends from the first side rib 63 parallel to the first mount plate 62 and retains and sandwiches the FPC body member 21 with the first mount plate 62. Each of the second retaining pieces 53B is a plate member that extends from the first side rib 63 parallel to the first mount plate 62 and is shorter than the first retaining piece 53A. The second retaining pieces 53B are disposed closer to the second holding unit 71 than the first retaining piece 53A is.

As illustrated in FIG. 11, the first holding unit 61 includes a first center rib 52A, positioning projections 54, and FPC stopper pieces 55 that project from the first mount surface 62F. The first center rib 52A is a thin elongated portion that extends parallel to the long sides 62LA, 62LB and is disposed corresponding to the first slit 22A. Each of the positioning projections 54 is a circular cylindrical projection projecting from the first mount surface 62F and disposed corresponding to each of the positioning holes 25. Although details are not illustrated, each of the FPC stopper pieces 55 includes a stopper piece body and a stopper projection and is disposed corresponding to each of the fitting holes 26. The stopper piece body extends from the first mount surface 62F and the stopper projection projects from a distal end of the stopper piece body.

As illustrated in FIGS. 9 and 11, the second holding unit 71 includes a second mount plate 72 (corresponding to the mount portion), a second side rib 73 projecting upward from the second mount plate 72, the first retaining piece 53A and the second retaining pieces 53B that are continuous from the second side rib 73.

As illustrated in FIGS. 9 and 11, the second mount plate 72 is a rectangular plate as a whole. The second mount plate 72 has one surface (an upper surface in FIG. 9) as a second mount surface 72F on which the FPC body member 21 is disposed. The second side rib 73 is a thin elongated portion that projects from a long side 72LA (the upper one in FIG. 11) out of the long sides 72LA, 72LB of the second mount plate 72. As illustrated in FIG. 11, the first retaining piece 53A extends from a middle portion of the second side rib 73. As illustrated in FIG. 11, the second retaining pieces 53B are disposed on both sides with respect to the first retaining piece 53A.

As illustrated in FIGS. 9 and 11, the second holding unit 71 includes a second center rib 52B, a third center rib 52C, the positioning projections 54, and the FPC stopper pieces 55 that project from the second mount surface 72F. The second center rib 52B is a thin elongated portion that extends parallel to the long sides 72LA, 72LB and is disposed corresponding to the first slit 22A. The third center rib 52C is a thin elongated portion that extends parallel to the long sides 72LA, 72LB and is disposed corresponding to the second slit 22B. The positioning projections 54 and the FPC stopper pieces 55 are disposed corresponding to the positioning holes 25 and the fitting holes 26, respectively, similar to those of the first holding unit 61.

As illustrated in FIGS. 9 and 11, the third holding unit 81 includes a third mount plate 82 (corresponding to the mount portion), a third side rib 83 projecting upward from the third mount plate 82, and the second retaining pieces 53B that are continuous from the third side rib 83.

As illustrated in FIGS. 9 and 11, the third mount plate 82 is a rectangular plate as a whole. The third mount plate 82 has one surface (an upper surface in FIG. 9) as a second mount surface 82F on which the FPC body member 21 is disposed. The third side rib 83 is a thin elongated portion that projects from a long side 82LA (the upper one in FIG. 11) out of the long sides 82LA, 82LB of the third mount plate 82. As illustrated in FIG. 11, the second retaining pieces 53B extend from the third side rib 83.

As illustrated in FIGS. 9 and 11, the third holding unit 81 includes a fourth center rib 52D, the positioning projections 54, and the FPC stopper pieces 55 that project from the third mount surface 82F. The fourth center rib 52D is a thin elongated portion that extends parallel to the long sides 82LA, 82LB of the third mount plate 82 and is disposed corresponding to the second slit 22B. The positioning projections 54 and the FPC stopper pieces 55 are disposed corresponding to the positioning holes 25 and the fitting holes 26, respectively, similar to those of the first holding unit 61.

Figure 10:
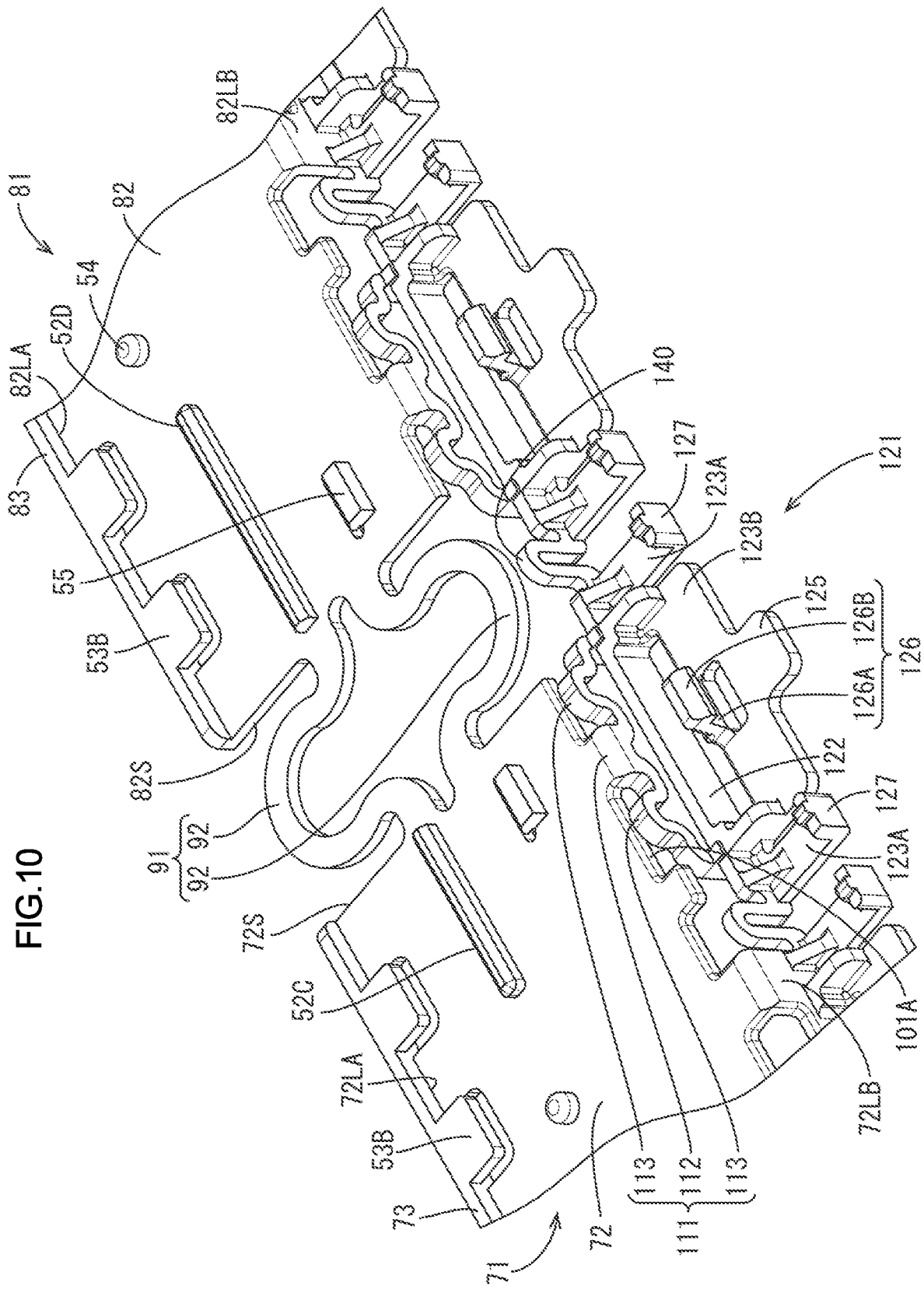
FIG. 10 is an enlarged view illustrating a portion surrounded by a frame R3 in FIG. 9.
Figure 12:
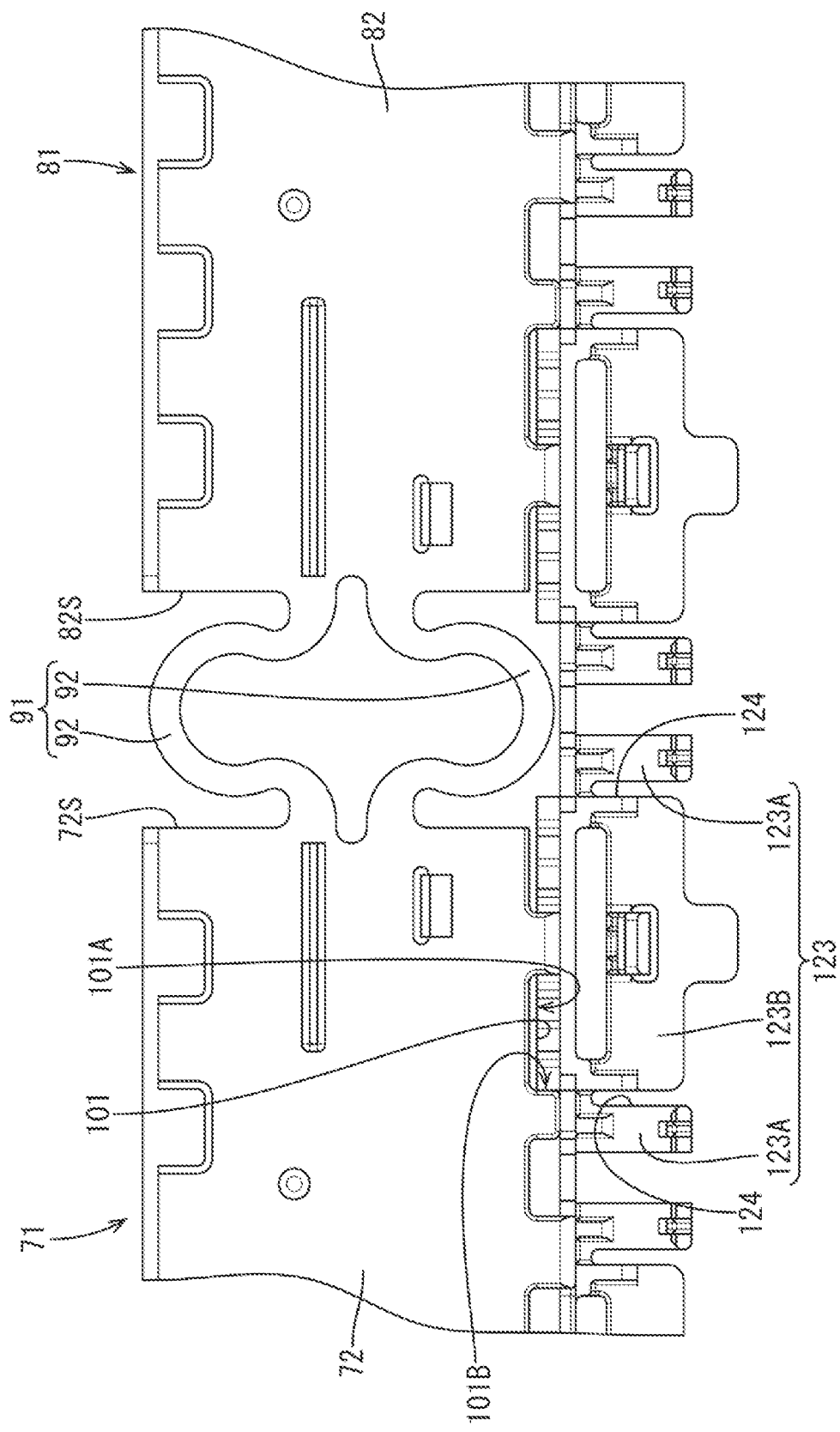
FIG. 12 is an enlarged view illustrating a portion surrounded by a frame R4 in FIG. 11.
Figure 13:
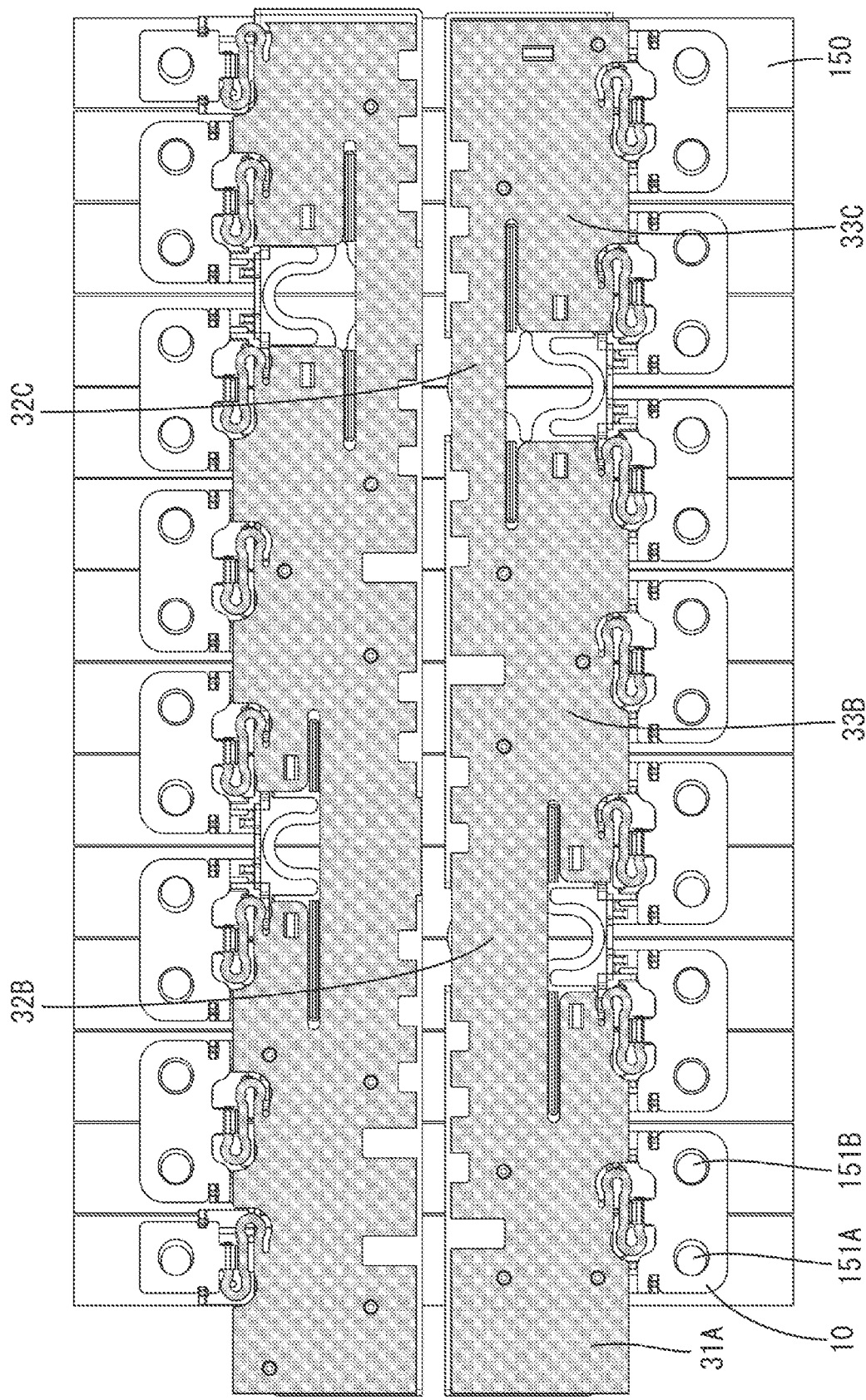
FIG. 13 is a plan view illustrating expandable/contractable portions that are expanded corresponding to position displacement of electrode terminals.

As illustrated in FIGS. 10 and 12, one of the two first connecting portions 91 includes two connecting spring portions 92 each having a U-shape and connects the second mount plate 72 and the third mount plate 82. The two connecting spring portions 92 are disposed to be opposed to each other. One end of the U-shape of each connecting spring portion 92 is connected to a short side 72S of the second mount plate 72 and another end thereof is connected to a short side 82S of the third mount plate 82. As illustrated in FIG. 9, another one of the two first connecting portions 91 has the same configuration as the one first connecting portion 91 and connects the first mount plate 62 and the second mount plate 72. The three holding units 61, 71, 81 are connected to each other by the first connecting portions 91 so as to be movable in the direction to be closer to and farther away from each other.

As illustrated in FIG. 9, among the bus bar holding portions 121, 131, one disposed at an end of the first holding unit 61 opposite from the second holding unit 71, one disposed at a middle of the second holding unit 71, and one disposed at an end of the third holding unit 81 opposite from the second holding unit 71 are fixed bus bar holding portions 131 and other ones are movable bus bar holding portions 121 that are connected to the holding units 61, 71, 81, respectively, via second deformable portions 111. In the following, the second deformable portions 111, the movable bus bar holding portions 121, and the fixed bus bar holding portion 131 included in the second holding unit 71 will be described. The configurations of the second deformable portions 111 and the bus bar holding portions 121, 131 included in the first holding unit 61 and the third holding unit 81 same as those of the second holing unit 71 are represented by the same symbols as those of the second holding unit 71 and will not be described.

As illustrated in FIG. 12, the second mount plate includes recessed portions 101 for springs that are recessed inward from the long side 72LB. The recessed portion 101 is defined by a second edge 101A that is parallel to the long side 72LB and two second side edges 101B that connect ends of the second edge 101A to the long side 72LB.

As illustrated in FIG. 10, the second deformable portion 111 includes a spring connection portion 112 and two spring plate portions 113. The spring connection portion 112 has a plate shape extending from the second edge 101A along a same plane surface as the first mount plate 62. The spring plate portions 113 extend from the spring connection portion 112 along the second edge 101A in opposite directions while being bent. Each of the spring plate portions 113 extends from the spring connection portion 112 along the second edge 101A while being curved in a U-shape and further extends vertically to the spring connection portion 112. Each of the spring plate portions 113 is a plate spring and can be expanded and contracted in the direction along the long side 72LB of the second mount plate 72 by the deformation of the U-shaped portions.

As illustrated in FIGS. 10 and 12, the movable bus bar holding portion 121 includes a back plate 122 that is continuous from the second deformable portion 111, a bottom plate portion 123 that is continuous from the back plate 122, an extended portion 125 extending from the bottom plate portion 123, a first bus bar stopper 126, and two second bus bar stoppers 127.

As illustrated in FIG. 10, the back plate 122 is a plate that is vertical to the second mount plate 72 and is connected to each of the distal ends of the spring plate portions 113.

As illustrated in FIGS. 10 and 12, the bottom plate portion 123 is a plate that extends vertically from the back plate 122 in an opposite direction from the second mount plate 72 and includes two third slits 124. Each of the two third slits 124 extends from the extended edge of the bottom plate portion 123 toward the back plate 122. The bottom plate portion 123 is divided into two edge plate portions 123A at two ends thereof and a middle plate portion 123B at a middle by the third slits 124. The extended portion 125 is a plate portion that extends from the extended edge of the bottom plate portion 123 along a same plane surface as that of the bottom plate portion 123.

As illustrated in FIG. 10, the first bus bar stopper 126 includes a first warping portion 126A and a first stopper projection 126B. The first warping portion 126A extends from the middle plate portion 123B and is spaced away from the back plate 122. The first stopper projection 126B projects from the extended end of the first warping portion 126A in a direction opposite from the back plate 122. The first warping portion 126A is slightly tilted so as to be farther away from the back plate 122 as it extends from the middle plate portion 123B.

As illustrated in FIG. 10, the two second bus bar stoppers 127 extend from the two edge plate portions 123A, respectively. Although details are not illustrated, each second bus bar stopper 127 includes a second warping portion and a second stopper projection. The second warping portions extend vertically from the extended edges of the two edge plate portions 123A, respectively, and the second stopper projections project from the distal ends of the second warping portions toward the back plate 122, respectively.

Each of the movable bus bar holding portions 121 is allowed to move to some extent with respect to the second mount plate 72 by the second deformable portion 111. Specifically, the movable bus bar holding portion 121 is movable in a direction along the long side 72LB (the X-axis direction) by the expansion and contraction of the two spring plate portions 113 of the second deformable portion 111.

As illustrated in FIG. 9, the fixed bus bar holding portion 131 does not have the second deformable portion 111 but has a configuration similar to that of the movable bus bar holding portion 121. The fixed bus bar holding portion 131 includes a back plate 132 extending from the long side 72LB of the second mount plate 72. The components of the fixed bus bar holding portion 131 same as those of the movable bus bar holding portion 121 are represented by the same symbols as those of the movable bus bar holding portion 121 and will not be described.

As illustrated in FIG. 9, the bus bar holding portions 121, 131 are arranged in a row. As illustrated in FIG. 10, two adjacent movable bus bar holding portions 121 are connected to each other by a U-shaped second connecting portion 140. Similarly, the fixed bus bar holding portion 131 and the movable bus bar holding portion 121 next thereto are connected to each other by the second connecting portion 140. With such a configuration, the adjacent movable bus bar holding portions 121 are connected to each other and the fixed bus bar holding portion 131 and the movable bus bar holding portion 121 next thereto are connected to each other so as to allow variation in a distance therebetween to some extent.

[Assembling of Connection Module 1A]

One example of steps of assembling the connection module 1A having the above configuration will be described below.

First, the bus bars 10 are connected to the FPC 20. The FPC connection portions 15 of the respective bus bars 10 are put on the respective connection portions of the FPC 20 and the FPC connection portions 15 and the connection portions are connected to each other, respectively, with reflow soldering. As illustrated in FIG. 6, the bus bars 10 that are connected to the FPC 20 are arranged in a row along the long side 21LA. The bus bars 10 are connected to the FPC body member 21 via the first deformable portions 41. Accordingly, the bus bars 10 can freely move to some extent in each of the direction along the long side 21LA of the FPC body member 21 (the X-axis direction), the direction to be closer to and farther away from the FPC body member 21 (the Y-axis direction), and the thickness direction of the FPC body member 21 (the Z-axis direction) by the deformation of the first deformable portions 41.

Next, the FPC 20 connected to the bus bars 10 is mounted on the resin protector 50.

First, the FPC body member 21 is mounted on the FPC holding portion 51. The FPC body member 21 is inserted into spaces between the mount plates 62, 72, 82 and the retaining pieces 53A, 53B to be placed on the mount plates 62, 72, 82. The positioning projections 54 are inserted in the positioning holes 25, respectively, and the center ribs 52A, 52B are fitted in the first slit 22A and the center ribs 52C, 52D are fitted in the second slit 22B. Accordingly, the first wiring portion 31A is positioned on the first mount plate 62, the second bus bar mount portion 33B is positioned on the second mount plate 72, and the third bus bar mount portion 33C is positioned on the third mount plate 82. The FPC stopper pieces 55 are fitted in the respective fitting holes 26 and fitted to the FPC body member 21 such that the edge portions of the first wiring portion 31A, the second bus bar mount portion 33B, and the third bus bar mount portion 33C are less likely to be peeled off from the mounting plates 62, 72, 82, respectively.

As illustrated in FIG. 3, the second retaining pieces 53B, which extend from the second side rib 73 and the third side rib 83, and each of the second mount plate 72 and the third mount plate 82 sandwich and hold the third expandable/contractable portion 32C such that the third expandable/contractable portion 32C can be deformed and bent to some extent. A distance between the second retaining pieces 53B and each of the second mount surface 72F and the third mount surface 82F is greater than the thickness of the FPC body member 21 (refer to FIG. 4). The second retaining pieces 53B hold the third expandable/contractable portion 32C such that the third expandable/contractable portion 32C can be deformed and bent to some extent. Similarly, the second retaining pieces 53B, which extend from the first side rib 63, and the second retaining pieces 53B, which extend from the second side rib 73, and each of the first mount plate 62 and the second mount plate 72 sandwich and hold the second expandable/contractable portion 32B such that the second expandable/contractable portion 32B can be deformed and bent to some extent.

Next, the bus bars 10 are mounted on the bus bar holding portions 121, 131, respectively. Each electrode connection portion 11 is pushed toward the bottom plate portion 123 while the first bus bar stopper 126 and the second bus bar stoppers 127 being warped. When the electrode connection portion 11 is contacted with the bottom plate portion 123, as illustrated in FIG. 7, the first bus bar stopper 126 elastically restores its original shape and the stopper wall 16 is sandwiched between the middle plate portion 123B and the first stopper projection 126B. The second bus bar stoppers 127 are inserted in the respective recessed portions 13 and fitted to the electrode connection portion 11. Thus, the bus bars 10 are fixed to the bus bar holding portions 121, 131, respectively. In such a configuration, the bus bars 10 are allowed to move freely to some extent with respect to the FPC body member 21 since the first deformable portions 41 can be deformed. Therefore, the bus bars 10 can be mounted on the bus bar holding portions 121, 131, respectively, easily. The bus bars 10 are easily mounted on the bus bar holding portions 121, 131, respectively, only by pushing the bus bars 10 toward the bottom plate portion 123.

As described before, the bus bars 10 are connected to the FPC body member 21 by the first deformable portions 41 so as to be movable with respect to the FPC body member 21 and the movable bus bar holding portions 121 are connected to the FPC holding portion 51 by the second deformable portions 111 so as to be movable with respect to the FPC holding portion 51. With such a configuration, the movable bus bar holding portions 121 and the bus bars 10 that are connected to each other are allowed to move with respect to the FPC holding portion 51 and the FPC body member 21 in a direction along the long sides 62LB, 72LB, 82LB of the holding units 61, 71, 81 and the long side 21LA of the FPC body member 21 (the X-axis direction).

[Mounting of Connection Module 1A on Power Storage Element Group 150G]

One example of steps of mounting the connection module 1A having the above configuration on the power storage element group 150G will be described below.

As illustrated in FIG. 1, the connection module 1A is disposed in a predefined position on the power storage element group 150G and the electrode terminals 151A, 151B are inserted in the electrode insertion holes 12 of the bus bars 10, respectively. Then, nuts, which are not illustrated, are screwed on the respective electrode terminals 151A, 151B to connect the electrode terminals 151A, 151B and each of the bus bars 10.

In the power storage element group 150G including the power storage elements 150, large dimension tolerance may be caused due to accumulation of the manufacturing dimension errors in the power storage elements 150 and the mounting errors of the power storage elements 150. In such a case, the position displacement of the electrode terminals 151A, 151B in the arrangement direction of the power storage elements 150 (the X-axis direction) may become greater.

In the present embodiment, the FPC body member 21 of the FPC 20 is divided into three portions including the first wiring portion 31A, the second wiring portion 31B including the second bus bar mount portion 33B, and the third wiring portion 31C including the third bus bar mount portion 33C. The bus bars 10 are connected to each of the first wiring portion 31A, the second bus bar mount portion 33B, and the third bus bar mount portion 33C. According to such a configuration, each of the first wiring portion 31A, the second bus bar mount portion 33B, and the third bus bar mount portion 33C is connected to some of the power storage elements 150 included in the power storage element group 150G. Therefore, the accumulation of the dimension errors and the mounting errors of the power storage elements 150 corresponding to each of the first wiring portion 31A, the second bus bar mount portion 33B, and the third bus bar mount portion 33C can be made smaller.

The second bus bar mount portion 33B is allowed to move in the direction to be closer to and farther away from the first wiring portion 31A and the third bus bar mount portion 33C by the expansion and contraction of the second expandable/contractable portion 32B. The third bus bar mount portion 33C is allowed to move in the direction to be closer to and farther away from the second bus bar mount portion 33B by the expansion and contraction of the third expandable/contractable portion 32C. According to such a configuration, the second bus bar mount portion 33B and the third bus bar mount portion 33C are moved corresponding to the position displacement of the electrode terminals 151A, 151B caused due to the dimension tolerance of the power storage element group 150G and the bus bars 10 can be fitted to the electrode terminals 151A, 151B.

Figure 2:
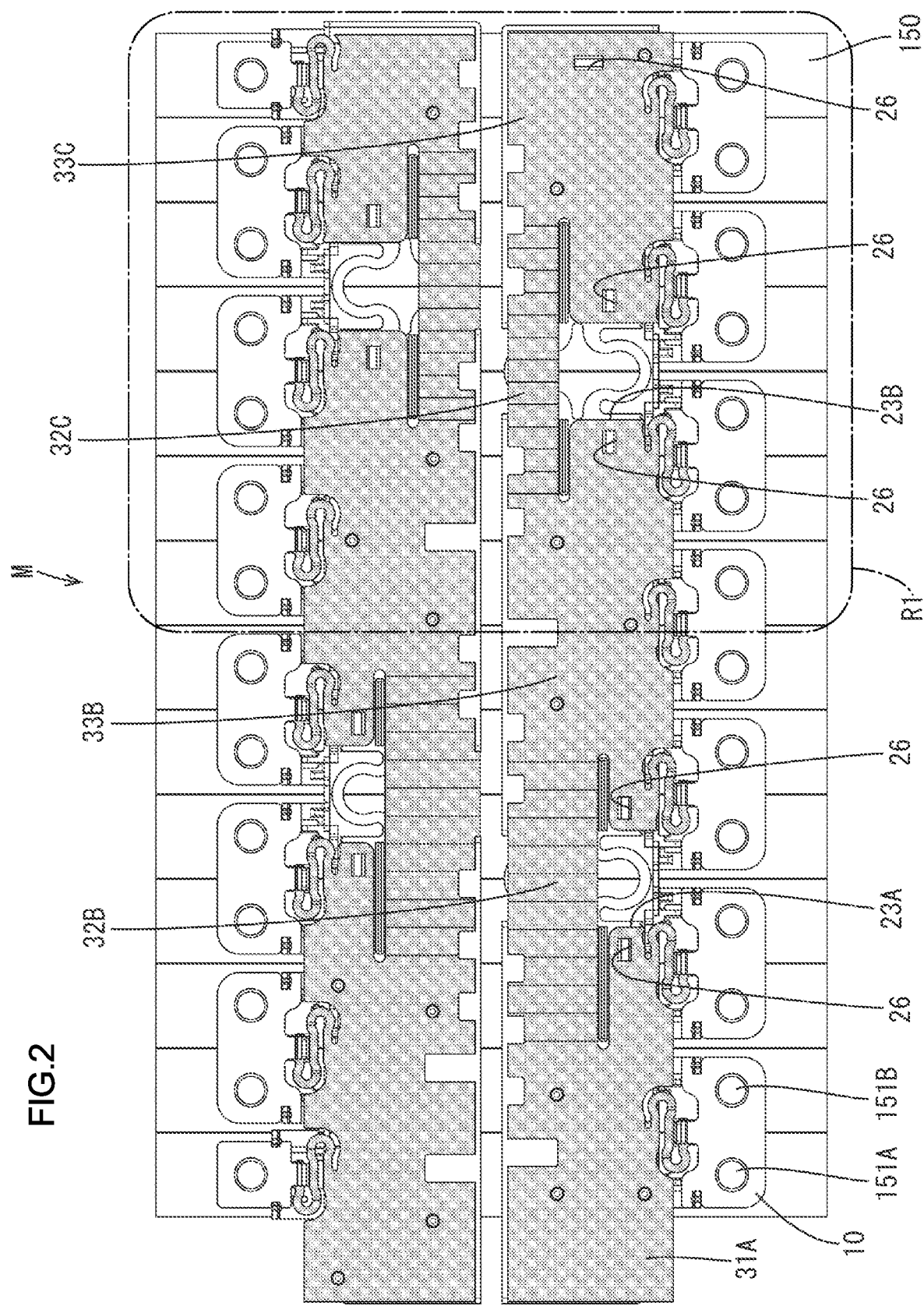
FIG. 2 is a plan view of the power storage module according to the embodiment.

For example, if the distance between the electrode terminals 151A, 151B is smaller than the predefined design dimension, the second expandable/contractable portion 32B is deformed and bent to reduce the length thereof and the distance between the first wiring portion 31A and the second bus bar mount portion 33B becomes smaller, as illustrated in FIG. 2. Similarly, the third expandable/contractable portion 32C is deformed and bent to reduce the length thereof and the distance between the second bus bar mount portion 33B and the third bus bar mount portion 33C becomes smaller. If the distance between the electrode terminals 151A, 151B is greater than the predefined design dimension, the second expandable/contractable portion 32B is expanded to increase the distance between the first wiring portion 31A and the second bus bar mount portion 33B. Similarly, the third expandable/contractable portion 32C is expanded to increase the distance between the second bus bar mount portion 33B and the third bus bar mount portion 33C. Thus, the position displacement of the electrode terminals 151A, 151B can be absorbed.

Furthermore, the movable bus bar holding portions 121 that are connected to the first holding unit 61 and the bus bars 10 that are mounted on the respective movable bus bar holding portions 121 are allowed to move with respect to the first wiring portion 31A and the first holding unit 61 on which the first wiring portion 31A is mounted. According to such a configuration, the bus bars 10 are connected to the electrode terminals 151A, 151B while moving the bus bars 10 corresponding to the position displacement of the electrode terminals 151A, 151B caused by the dimension tolerance of the power storage element group 150G. The configurations and operations of the second bus bar mount portion 33B and the second holding unit 71 and those of the third bus bar mount portion 33C and the third holding unit 81 are similar to those described before.

For example, if the distance between the electrode terminals 151A, 151B is smaller than the predefined design dimension, the second deformable portions 111 and the second connecting portions 140 are deformed to move the movable bus bar holding portions 121 to be closer to the fixed bus bar holding portion 131 that is referred to as the reference position. Accordingly, with reference to the bus bar 10 held on the fixed bus bar holding portion 131, other bus bars 10 are moved such that the distances between the adjacent bus bars 10 become smaller to deal with the position displacement of the electrode terminals 151A, 151B.

If the distance between the electrode terminals 151A, 151B is greater than the predefined design dimension, the second deformable portions 111 and the second connecting portions 140 are deformed to move the movable bus bar holding portions 121 to be farther away from the fixed bus bar holding portion 131 that is referred to as the reference position. Accordingly, with reference to the bus bar 10 held on the fixed bus bar holding portion 131, other bus bars 10 are moved such that the distances between the adjacent bus bars 10 become greater to deal with the position displacement of the electrode terminals 151A, 151B.

Accordingly, difficulty of mounting the connection module 1A on the power storage element group 150G caused by the dimension tolerance of the power storage element group 150G is less likely to be caused and the mounting operability is improved.

Since the FPC 20 and the bus bars 10 are mounted on the resin protector 50, the FPC 20 having flexibility can maintain its shape and the FPC 20 and the bus bars 10 are collectively mounted in a predefined position on the power storage element group 150G.

The resin protector 50 includes three holding units 61, 71, 81 and the first wiring portion 31A is positioned on and held by the first mount plate 62, the second bus bar mount portion 33B is positioned on and held by the second mount plate 72, and the third bus bar mount portion 33C is positioned on and held by the third mount plate 82. The three holding units 61, 71, 81 are connected to each other by the first connecting portions 91 so as to be movable in the direction to be closer to and farther away from each other. According to such a configuration, the distances between the three holding units 61, 71, 81 can be changed corresponding to the change in the distances between the first wiring portion 31A, the second bus bar mount portion 33B, and the third bus bar mount portion 33C. Thus, the FPC 20 can be held by the resin protector 50 without hindering the absorption of the dimension tolerance caused by the change in the distances between the first wiring portion 31A, the second bus bar mount portion 33B, and the third bus bar mount portion 33C.

SUMMARY

As previously described, according to the present embodiment, the connection module 1A is a module that is mounted on the power storage element group 150G including the power storage elements 150 having the electrode terminals 151A, 151B and connects the power storage elements 150. The connection module 1A includes the FPC 20 and the bus bars 10 that are connected to the FPC 20 and connect the electrode terminals 151A, 151B of the adjacent power storage elements 150. The FPC 20 includes the first wiring portion 31A, the second bus bar mount portion 33B, and the third bus bar mount portion 33C that are connected to the bus bars 10. The FPC 20 includes the second expandable/contractable portion 32B and the third expandable/contractable portion 32C. The second expandable/contractable portion 32B is continuous from the second bus bar mount portion 33B and allowed to be expanded and contracted in the direction to be closer to and farther away from the first wiring portion 31A and the third bus bar mount portion 33C. The third expandable/contractable portion 32C is continuous from the third bus bar mount portion 33C and allowed to be expanded and contracted in the direction to be closer to and farther away from the second bus bar mount portion 33B.

According to the above configuration, each of the first wiring portion 31A, the second bus bar mount portion 33B, and the third bus bar mount portion 33C is connected to some of the power storage elements 150 included in the power storage element group 150G. Therefore, the accumulation of the dimension errors and the mounting errors of the power storage elements 150 corresponding to each of the first wiring portion 31A, the second bus bar mount portion 33B, and the third bus bar mount portion 33C can be made smaller. The distances between the first wiring portion 31A, the second bus bar mount portion 33B, and the third bus bar mount portion 33C are changed by the expansion or contraction of the second expandable/contractable portion 32B and the third expandable/contractable portion 32C to deal with the position displacement of the electrode terminals 151A, 151B. Accordingly, difficulty of mounting the connection module 1A on the power storage element group 150G caused by the dimension tolerance of the power storage element group 150G is less likely to be caused and the mounting operability is improved.

The second expandable/contractable portion 32B and the third expandable/contractable portion 32C are bent along the fold lines 24 that are parallel to each other so as to be bent in a waveform including projection portions and recess portions alternately. With such a configuration, the second expandable/contractable portion 32B and the third expandable/contractable portion 32C have a simple configuration and this avoids complicating of the configuration of the connection module 1A.

The connection module 1A includes the resin protector 50 that holds the bus bars 10 and the FPC 20. The resin protector 50 includes the holding units 61, 71, 81 and the first connecting portions 91. The holding units 61, 71, hold the first wiring portion 31A, the second bus bar mount portion 33B, and the third bus bar mount portion 33C, respectively. The adjacent ones of the holding units 61, 71, are connected to each other by the first connecting portions 91 so as to move in the direction to be closer to and farther away from each other.

According to such a configuration, the FPC 20 having flexibility can maintain its shape and the FPC 20 and the bus bars 10 are collectively mounted in a predefined position on the power storage element group 150G. The distances between the adjacent ones of the holding units 61, 71, 81 can be changed via the first connecting portions 91 according to the change in the distances between the first wiring portion 31A, the second bus bar mount portion 33B, and the third bus bar mount portion 33C. Accordingly, the FPC 20 can be held by the resin protector 50 without hindering the movement of the first wiring portion 31A, the second bus bar mount portion 33B, and the third bus bar mount portion 33C.

The second holding unit 71 includes the second mount plate 72 on which the FPC 20 is disposed and the first retaining piece 53A and the second retaining pieces 53B that retain the second expandable/contractable portion 32B and the third expandable/contractable portion 32C. The second expandable/contractable portion 32B and the third expandable/contractable portion 32C are sandwiched between the second mount plate 72 and the second retaining pieces 53B. The distance between the second mount plate 72 and the second retaining pieces 53B is greater than the thickness of the FPC 20. The third holding unit 81 has the same configuration as described above. According to such a configuration, the FPC 20 can be held by the resin protector 50 without hindering the expansion and contraction of the second expandable/contractable portion 32B and the third expandable/contractable portion 32C.

OTHER EMBODIMENTS

The technology disclosed herein is not limited to the embodiment described above and illustrated in the drawings. For example, the following embodiments will be included in the technical scope of the technology.

(1) In the above embodiment, the FPC 20 includes the first wiring portion 31A, the second bus bar mount portion 33B, and the third bus bar mount portion 33C. However, the flexible printed circuit board may include two or four connection member mount portions or more. The number of the expandable/contractable portions and the number of the holding units may be changed corresponding to the number of the connection member mount portions.

(2) In the above embodiment, the first connecting portions 91 include two U-shaped connecting spring portions that are opposed to each other. However, the first connecting portion 91 may have any shape as long as the adjacent holding units can be connected so as to be movable in the direction to be closer to and farther away from each other. For example, the first connecting portion 91 may be one U-shaped spring portion or a S-shaped spring portion.

EXPLANATION OF SYMBOLS

1: Connection module
10: Bus bar (connection member)
20: FPC (flexible printed circuit board)
24: Fold line
31A: First wiring portion (connection member mount portion)
32B: Second expandable/contractable portion (expandable/contractable portion)
32C: Third expandable/contractable portion (expandable/contractable portion)
33B: Second bus bar mount portion (connection member mount portion)
33C: Third bus bar mount portion (connection member mount portion)
50: Resin protector (holding member)
53A: First retaining piece
53B: Second retaining piece (retaining portion)
61: First holding unit (holding unit)
62: First mount plate (mount portion)
71: Second holding unit (holding unit)
72: Second mount plate (mount portion)
81: Third holding unit (holding unit)
82: Third mount plate (mount portion)
91: First connecting portion (connecting portion)
150: Power storage element

The invention claimed is:

1. A connection module to be mounted on a power storage element group including power storage elements having electrode terminals and connecting the power storage elements, the connection module comprising:
   a flexible printed circuit board;
   connection members connected to the flexible printed circuit board and connecting the electrode terminals of the power storage elements that are adjacent to each other, wherein
   the flexible printed circuit board includes connection member mount portions to which the connection members are connected, and an expandable/contractable portion that is continuous from one connection member mount portion out of the connection member mount portions and allowed to be expanded and contracted in a direction to be closer to and farther away from another connection member mount portion out of the connection member mount portions that is adjacent to the one connection member mount portion, and wherein
   the flexible printed circuit board has a slit provided between the one connection member mount portion and the expandable/contractable portion; and
   a holding member that holds the connection members and the flexible printed circuit board, wherein the holding member includes a rib that is inserted into the slit.

2. The connection module according to claim 1, wherein the expandable/contractable portion is bent along fold lines extending parallel to each other and has a waveform including projection portions and recess portions alternately.

3. The connection module according to claim 2, wherein the holding member includes holding units that hold the connection member mount portions, respectively, and a connecting portion that connects the holding units that are adjacent to each other such that the holding units adjacent to each other are movable in a direction to be closer to and farther away from each other, and wherein the rib is provided on at least one of the holding units.

4. The connection module according to claim 3, wherein each of the holding units includes a mount portion on which the flexible printed circuit board is disposed and a retaining portion that sandwiches and holds the expandable/contractable portion with the mount portion, and
   a distance between the mount portion and the retaining portion is greater than a thickness of the flexible printed circuit board.

5. The connection module according to claim 1, wherein the holding member includes holding units that hold the connection member mount portions, respectively, and a connecting portion that connects the holding units that are adjacent to each other such that the holding units adjacent to each other are movable in a direction to be closer to and farther away from each other, and wherein the rib is provided on at least one of the holding units.

6. The connection module according to claim 5, wherein each of the holding units includes a mount portion on which the flexible printed circuit board is disposed and a retaining portion that sandwiches and holds the expandable/contractable portion with the mount portion, and
   a distance between the mount portion and the retaining portion is greater than a thickness of the flexible printed circuit board.

* * * * *